US012628497B2

(12) United States Patent
Choi et al.

(10) Patent No.: US 12,628,497 B2
(45) Date of Patent: May 12, 2026

(54) DISPLAY DEVICE

(71) Applicant: LG Display Co., Ltd., Seoul (KR)

(72) Inventors: Suk Choi, Hwaseong-si (KR);
KyungHwan Oh, Paju-si (KR);
Kyungmin Yeo, Paju-si (KR)

(73) Assignee: LG Display Co., Ltd., Seoul (KR)

( * ) Notice: Subject to any disclaimer, the term of this
patent is extended or adjusted under 35
U.S.C. 154(b) by 630 days.

(21) Appl. No.: 17/953,474

(22) Filed: Sep. 27, 2022

(65) Prior Publication Data

US 2023/0180519 A1    Jun. 8, 2023

(30) Foreign Application Priority Data

Dec. 8, 2021    (KR) ........................ 10-2021-0174895

(51) Int. Cl.
H10K 50/85    (2023.01)
H10K 50/80    (2023.01)
H10K 50/86    (2023.01)
H10K 102/00    (2023.01)

(52) U.S. Cl.
CPC ..... H10K 50/868 (2023.02); H10K 2102/311
(2023.02)

(58) Field of Classification Search
CPC ...... H10K 50/868; H10K 50/85; H10K 50/86;
H10K 59/8791; H10K 2102/311; G09F
9/301; G02B 5/3083
See application file for complete search history.

(56) References Cited

U.S. PATENT DOCUMENTS

| | | | |
|---|---|---|---|
| 2014/0168579 A1 | 6/2014 | Kim et al. | |
| 2014/0254013 A1 | 9/2014 | Lim et al. | |
| 2015/0369981 A1* | 12/2015 | Takeda | H10K 59/8791 |
| | | | 359/488.01 |
| 2018/0284332 A1* | 10/2018 | Murashige | H10K 50/86 |
| 2019/0177577 A1* | 6/2019 | Yamasaki | G09F 9/00 |
| 2019/0204677 A1 | 7/2019 | Kim et al. | |

(Continued)

FOREIGN PATENT DOCUMENTS

| | | |
|---|---|---|
| CN | 103869402 A | 6/2014 |
| CN | 109643035 A | 4/2019 |

(Continued)

OTHER PUBLICATIONS

Office Action dated Jun. 23, 2025, issued in counterpart KR
Application No. 10-2021-0174895.

(Continued)

*Primary Examiner* — Omar F Mojaddedi
(74) *Attorney, Agent, or Firm* — Morgan, Lewis &
Bockius LLP

(57)    ABSTRACT

A display device having a display panel, a polarization film
disposed on the display panel, and a plurality of retardation
films disposed on the polarization film. Each of the plurality
of retardation films has different in-plane phase differences
$R_{in}$, and the in-plane phase difference $R_{in}$ of each of the
plurality of retardation films is 10000 nm or larger. Accord-
ing to an example embodiment, a color distortion, such as
color irregularity, a color shift, and interference colors, is
improved and the visibility of the rainbow stain is mini-
mized or reduced.

15 Claims, 17 Drawing Sheets

100

(56)  References Cited

U.S. PATENT DOCUMENTS

| | | | |
|---|---|---|---|
| 2019/0278010 A1* | 9/2019 | Sakai | .................. G02F 1/13363 |
| 2019/0378883 A1* | 12/2019 | Yu | ........................ G02B 5/3016 |
| 2020/0259124 A1* | 8/2020 | Kim | .................. H10K 59/8792 |
| 2021/0223602 A1 | 7/2021 | Kim et al. | |

FOREIGN PATENT DOCUMENTS

| | | |
|---|---|---|
| JP | 2017-122910 A | 7/2017 |
| KR | 10-2014-0109084 A | 9/2014 |
| KR | 10-2017-0038594 A | 4/2017 |
| KR | 10-2017-0079651 A | 7/2017 |
| KR | 10-2020-0019563 A | 2/2020 |
| KR | 10-2020-0098751 A | 8/2020 |
| KR | 10-2020-0133756 A | 11/2020 |

OTHER PUBLICATIONS

Office Action dated Nov. 12, 2025, issued in CN Application No. 202211255242.6 (with machine translation).

* cited by examiner

DISPLAY DEVICE

CROSS-REFERENCE TO RELATED APPLICATION

This application claims the benefit of and the priority to Korean Patent Application No. 10-2021-0174895 filed on Dec. 8, 2021, in the Korean Intellectual Property Office. The disclosure of Korean Patent Application No. 10-2021-0174895 is incorporated by reference as if fully set forth herein.

BACKGROUND

1. Technical Field

The present disclosure relates to a display device, and more particularly, to a display device which may have a reduced rainbow stain to lead to excellent display quality. The display device may be easily implemented as a flexible display device.

2. Description of the Related Art

In an information era, a display field involving expressing electrical information signals visually develops rapidly. In response to this, various display devices having excellent features, such as thin-thickness, light weight, and low power consumption, have been developed. Specific examples of such a display device include a liquid crystal display device (LCD), a plasma display panel device (PDP), a field emission display device (FED), and an organic light emitting display device (OLED).

Among the various display devices, an organic light emitting display device may not require a separate light source. Therefore, the organic light emitting display device may be manufactured as a light weight and thin device. The organic light emitting display device may be manufactured easily, and may have a low power consumption due to the low voltage driving. The organic light emitting display device may include a self-emitting element and layers formed of organic thin films so that the flexibility and elasticity may be superior to the other display devices and facilitate the implementation as a flexible display device.

Generally, in the organic light emitting display device, in order to suppress the degradation of the visibility and the contrast ratio due to external light which may be incident on the display device, a polarization film may be disposed on the display panel and a protective film may be disposed to protect the polarization film.

SUMMARY

In the display device of the related art, a polyethylene terephthalate (PET) film may be mainly laminated on the polarization film to protect the polarization film. The PET film is inexpensive and has an excellent durability, but has a birefringence characteristic such that when the PET film is used as the protective film, there may be a problem in that the display quality may be degraded due to an optical distortion.

In order to reduce the optical distortion, a high retardation film known as a stretched PET film or a super retardation film (SFR) may be laminated on the polarization film. However, in this case, when the user wears polarized sunglasses and views an image of the display device, rainbow stains are visible such that the display quality may be degraded (so-called "rainbow effect").

Accordingly, an object to be achieved by the present disclosure is to provide a display device that is capable of having an excellent display quality by minimizing or reducing visibility of a rainbow stain.

Further, an object of the present disclosure is to provide a display device that may have an excellent folding reliability while maintaining a high display quality to be implemented as various flexible display devices such as a foldable display device or a rollable display device.

Objects of the present disclosure are not limited to the above-mentioned objects. Other objects, which are not mentioned above, can be clearly understood by those skilled in the art from the following disclosure.

According to an aspect of the present disclosure, a display device may include a display panel, a polarization film disposed on the display panel, a plurality of retardation films disposed on the polarization film, where an in-plane phase difference $R_{in}$ of each of the plurality of retardation films is different, and where the in-plane phase difference $R_{in}$ of each of the plurality of retardation films is 10000 nm or larger.

Other details of the example embodiments are included in the detailed description and the drawings.

According to an example embodiment of the present disclosure, a color distortion, such as color irregularity, a color shift, and interference colors, may improve and the visibility of the rainbow stain may be minimized or reduced.

According to an example embodiment of the present disclosure, the rainbow stain may not be visible from the front and at a lateral viewing angle so that a display device may have an excellent display quality.

Further, according to an example embodiment of the present disclosure, a folding reliability may be ensured with the excellent display quality so that various types of flexible display device may be implemented.

The effects according to the present disclosure are not limited to the contents exemplified above. More effects are disclosed in the following sections.

BRIEF DESCRIPTION OF THE DRAWINGS

The above and other aspects, features and other advantages of the present disclosure will be more clearly understood from the following detailed description taken in conjunction with the accompanying drawings.

DETAILED DESCRIPTION

Figure 1:
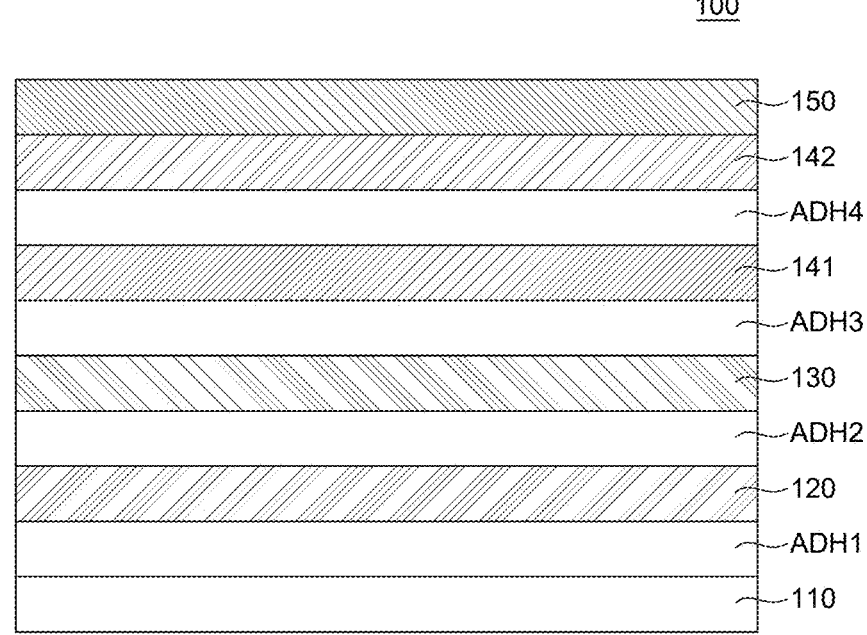
FIG. 1 illustrates a cross-sectional view of a display device according to an example embodiment of the present disclosure.

Advantages and characteristics of the present disclosure and a method of achieving the advantages and characteristics are described below through the following example embodiments described with reference to the accompanying drawings. The present disclosure is not limited to the example embodiments disclosed herein and may be implemented in various forms. The example embodiments are provided by way of example only so that those skilled in the art may fully understand the description of the present disclosure and the scope of the present disclosure. The protected scope of the present disclosure is defined by claims and their equivalents.

The shapes, sizes, thicknesses, ratios, angles, numbers, and the like of each component illustrated in the accompanying drawings to describe the example embodiments of the present disclosure are illustrated for convenience of description and are merely examples. The present disclosure is not limited to the illustrations in the drawings. The same or similar elements are designated by the same reference numerals throughout the specification unless otherwise specified.

Further, in the following description of the present disclosure, where the detailed description of the relevant known function or configuration may unnecessarily obscure an important point of the present disclosure, a detailed description of such known function of configuration may be omitted.

In the present specification, where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

In the description of the various embodiments of the present disclosure, where positional relationships are described, for example, where the positional relationship between two parts is described using "on," "over," "under,"

"above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

The expression that an element or layer is "connected," "coupled," or "adhered" to another element or layer means that the element or layer can not only be directly connected or adhered to another element or layer, but also be indirectly connected or adhered to another element or layer with one or more intervening elements or layers "disposed," or "interposed" between the elements or layers, unless otherwise specified.

Although the terms "first," "second," A, B, (a), (b), and the like may be used herein to describe various elements, the elements should not be interpreted to be limited by these terms as they are not used to define a particular order, precedence, or number of the corresponding elements. These terms are used only to identify one element from another. For example, a first element could be termed a second element, and similarly, a second element could be termed a first element, without departing from the scope of the present disclosure.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

Hereinafter, a display device according to example embodiments of the present disclosure will be described in detail with reference to accompanying drawings.

FIG. 1 illustrates a cross-sectional view of a display device according to an example embodiment of the present disclosure. As illustrated in FIG. 1, a display device 100 according to an example embodiment of the present disclosure may include a display panel 110, a polarization film 120, a plurality of retardation films 141 and 142, a support film 130, a hard coating layer 150, and a plurality of adhesive layers ADH1, ADH2, ADH3, and ADH4.

The display panel 110 may be a component that displays images. The display panel 110 may include a display area and a non-display area. The display area may be an area where a plurality of pixels may be disposed to display images. In the display area, pixels including an emission area for displaying images and a driving circuit for driving the pixels may be disposed. The non-display area may be disposed so as to enclose the display area. The non-display area may be an area where images may not be displayed. The non-display area may include various wiring lines, driving ICs, and printed circuit boards for driving the pixels and the driving circuits disposed in the display area.

For example, the display panel 110 may be an organic light emitting display panel which may include an organic light emitting diode to display images using light emitted from the organic light emitting diode. Hereinafter, for the convenience of description, the description will be made with an example that the display panel may be an organic light emitting display panel, but is not limited thereto.

The display panel 110 may have flexibility. Accordingly, the display panel 110 may be modified to be in various forms, such as curved, folded, bent, or rolled, while maintaining the display quality.

For example, the display panel 110 may include a flexible substrate, a thin film transistor, and an organic light emitting diode.

The flexible substrate may support various elements which configure the display panel 110. The flexible substrate may be a plastic substrate having flexibility. For example, the plastic substrate may be at least one selected from polyimide, polyethersulfone, polyethylene terephthalate, and polycarbonate, but is not limited thereto.

The organic light emitting diode may be disposed on the flexible substrate. The organic light emitting diode may include an anode, a cathode, and an organic light emitting layer disposed therebetween. In the organic light emitting diode, holes injected from the anode and electrons injected from the cathode may couple on the organic light emitting layer to emit light. An image may be displayed using the light emitted as described above.

A driving thin film transistor may be disposed between the flexible substrate and the organic light emitting diode to drive the organic light emitting diode. The driving thin film transistor may be disposed in each of the plurality of sub pixel areas. For example, the driving thin film transistor may include a gate electrode, an active layer, a source electrode, and a drain electrode.

The polarization film 120 may be disposed on the display panel 110. The polarization film 120 may selectively transmit light to reduce the reflection of external light, which may be incident on the display panel 110. For example, the display panel 110 may include various metal materials applied to a thin film transistor, a wiring line, and an organic light emitting diode. Therefore, the external light, which may be incident on the display panel 110, may be reflected from the metal material having a high reflectivity so that the visibility of the display device 100 may be reduced due to the reflection of the external light. The polarization film 120 may linearly polarize the external light in a predetermined direction. Accordingly, the reflection of the external light may be minimized or reduced. The visibility and the contrast ratio of the display device 100 may improve.

For example, the polarization film 120 may be at least one selected from an iodine-based polarization film, a dye-based polarization film, and a polyene-based polarization film, but is not limited thereto. The iodine-based polarization film may be oriented by polyvinyl alcohol (PVA) chains in which iodine or iodide ion chains may be stretched to show a polarizing property. The dye-based polarization film may be oriented by PVA chains in which dichroic dyes may be stretched to show a polarizing property. The polyene-based polarization film may show a polarizing property by forming polyene by a dehydration reaction of the PVA film or a dehydrochlorination reaction of a polyvinyl chloride (PVC) film.

Optionally, a λ/4 retardation film may be disposed between the display panel 110 and the polarization film 120. When the light reflected by a metal layer reaches the polarization film 120, the λ/4 retardation film may change the optical path so that the reflected light may not pass through the polarization film 120 to reduce the degradation of the visibility due to the reflected light.

The polarization film 120 may be bonded onto the display panel 110 by the first adhesive layer ADH1. The first adhesive layer ADH1 may be formed using an optically clear adhesive for a display, such as a pressure sensitive adhesive, an optically clear adhesive, or an optical clear resin. However, when the polarization film 120 is formed from a film-forming a liquid coating agent, the first adhesive layer ADH1 may be omitted.

The support film 130 may be disposed on the polarization film 120. The support film 130 may support a plurality of retardation films 141 and 142 described below. For example, the support film 130 may be a transparent thin film glass or plastic film. For example, the plastic film may be formed of at least one material selected from polyethylene terephthalate, polyimide, polymethyl methacrylate, polycarbonate, and polypropylene, but is not limited thereto.

The support film 130 may be bonded onto the polarization film 120 by the second adhesive layer ADH2. For example, the second adhesive layer ADH2 may be formed using an optically clear adhesive for a display, such as a pressure sensitive adhesive, an optically clear adhesive, or an optical clear resin.

A plurality of retardation films 141 and 142 may be disposed on the support film 130. The plurality of retardation films 141 and 142 may include a first retardation film 141 and a second retardation film 142, as an example, but is not limited thereto.

The first retardation film 141 may be disposed on the support film 130. At this time, the first retardation film 141 and the support film 130 may be bonded by the third adhesive layer ADH3. For example, the third adhesive layer ADH3 may be formed using an optically clear adhesive for a display, such as a pressure sensitive adhesive, an optically clear adhesive, or an optical clear resin.

The second retardation film 142 may be disposed on the first retardation film 141. At this time, the fourth adhesive layer ADH4 may be disposed between the second retardation film 142 and the first retardation film 141. The fourth adhesive layer ADH4 bonds the second retardation film 142 and the first retardation film 141. For example, the fourth adhesive layer ADH4 may be at least one selected from a pressure sensitive adhesive, an optically clear adhesive, and an optical clear resin, but is not limited thereto.

For example, each of the first retardation film 141 and the second retardation film 142 may be a film formed of or include at least one of polyethylene terephthalate, polyethersulfone, polycarbonate, polyimide, polypropylene, cycloolefin polymer, cycloolefin copolymer, and polymethylmethacrylate. For example, each of the first retardation film 141 and the second retardation film 142 may be a polyethylene phthalate film. This may have advantages of being inexpensive, easy to obtain, and easy to control a physical property such as a phase difference.

For example, an in-plane phase difference $R_{in}$ of each of the first retardation film 141 and the second retardation film 142 may be 10000 nm or higher. An in-plane phase difference of the first retardation film 141 and an in-plane phase difference of the second retardation film 142 may be different from each other. As described above, when the first retardation film 141 and the second retardation film 142 having different in-plane phase differences that are 10000 nm or larger are laminated on the polarization film 120, the rainbow stain may be improved so that the visibility of the display device 100 may become excellent. For example, according to an example embodiment of the present disclosure, when the user views the screen while wearing polarized sunglasses, the rainbow stain may not be visible and a high quality image can be viewed.

For example, the in-plane phase difference of the first retardation film 141 may be 10000 nm to 15000 nm. The in-plane phase difference of the second retardation film 142 may be 20000 nm to 23000 nm. When the in-plane phase difference of each of the first retardation film 141 and the second retardation film 142 is within the above-mentioned range, the rainbow stain may be effectively reduced. When the in-plane phase difference is too low, the visibility improvement effect and the rainbow stain improvement effect may be insignificant. The in-plane phase differences of the first retardation film 141 and the second retardation film 142 may be controlled according to a stretching ratio, a stretching temperature, and/or a thickness of the film. Generally, the higher the stretching ratio, the lower the stretching temperature, and/or the larger the thickness, the higher the in-plane phase difference. For example, in order to control the in-plane phase differences of the first retardation film 141 and the second retardation film 142 to be high, the stretching ratio or the thickness of the film may be increased. In order to provide a retardation film having a high in-plane phase difference, the stretching ratio may be increased to an extent before the stretching ratio becomes undesirable because the process efficiency may be degraded at higher stretching ratios and the improvement in visibility and the rainbow stain may be degraded along with the process efficiency. Further, when the film is too thick, the thickness of the display device is increased and may limit the potential of the display device to be applied as a flexible display device such as a foldable or rollable display device. In some embodiments, the in-plane phase differences of the first retardation film 141 and the second retardation film 142 may be controlled to fall within the above-mentioned ranges.

For example, the thickness of each of the first retardation film 141 and the second retardation film 142 may be 30 μm to 120 μm. Within this range, the in-plane phase difference of each film may have a value within the disclosed range to appropriately maintain the thickness of the display device 100 and to ensure the folding reliability. The display device 100 may become slim and may be implemented as a flexible display device.

Further, when the film is too thick, a thickness direction phase difference $R_{th}$ may be increased such that the visibility improvement and the rainbow stain improvement effect of the display device may be insignificant. For example, the thickness direction phase difference of each of the first retardation film 141 and the second retardation film 142 may be 0.5 times or less of the in-plane phase difference. For example, when the in-plane phase difference of the first retardation film 141 is 10000 nm, the thickness direction phase difference may be 5000 nm or less. When the in-plane phase difference of the second retardation film 142 is 20000 nm, the thickness direction phase difference may be 10000 nm or less. The visibility and the rainbow stain of the display device may be effectively improved.

Figure 2:
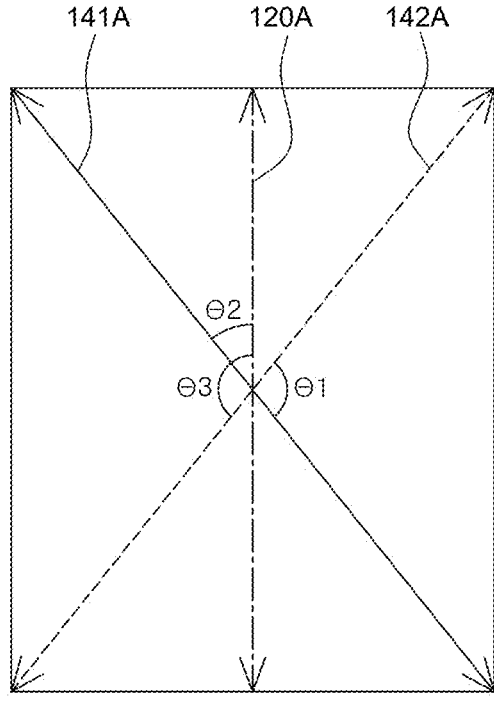
FIG. 2 illustrates optical axes of a first retardation film, a second retardation film, and a polarization film in a plane.

In order to further improve the display quality, an optical axis of each of the first retardation film 141, the second retardation film 142, and the polarization film 120 may be controlled. Hereinafter, the optical axes of each of the first retardation film 141, the second retardation film 142, and the polarization film 120 will be described with reference to FIG. 2 together. FIG. 2 illustrates optical axes of a first retardation film, a second retardation film, and a polarization film in a plane.

As illustrated in FIG. 2, an angle θ1 formed by an optical axis 141A of the first retardation film 141 and an optical axis 142A of the second retardation film 142 may be 90±10°. An angle θ2 formed by the optical axis 141A of the first retardation film 141 and an optical axis 120A of the polarization film 120 may be 45±10° or 135±10°. An angle θ3 formed by the optical axis 142A of the second retardation film 142 and the optical axis 120A of the polarization film 120 may be 45±10° or 135±10°. In an example embodiment, when the angle θ2 formed by the optical axis 141A of the first retardation film 141 and the optical axis 120A of the polarization film 120 may be 45±10°, the angle θ3 formed by the optical axis 142A of the second retardation film 142 and the optical axis 120A of the polarization film 120 may be 135±10°. In an example embodiment, when the angle θ3 formed by the optical axis 142A of the second retardation film 142 and the optical axis 120A of the polarization film 120 may be 45±10°, the angle θ2 formed by the optical axis 141A of the first retardation film 141 and the optical axis 120A of the polarization film 120 may be 135±10°. In the example embodiments, when the user views the image of the display device 100 while wearing the polarized sunglasses, the rainbow stain may be not visible so that the display quality may be excellent.

A storage modulus of each of the first retardation film 141 and the second retardation film 142 may be $10^6$ Pa to $10^9$ Pa. A Poisson ratio of each of the first retardation film 141 and the second retardation film 142 may be 0.30 to 0.43. The storage modulus and the Poisson ratio are physical properties related to the folding characteristic of the first retardation film 141 and the second retardation film 142. When the storage modulus and the Poisson ratio are in the above-mentioned range, the folding characteristic and the reliability of the film may be excellent so that the display device may be easily implemented as a flexible display device such as a foldable or rollable display device. The storage modulus and the Poisson ratio may be measured by a method defined in ASTM E2001-13 at room temperature (20±5° C.).

As illustrated in FIG. 1, the hard coating layer 150 may be disposed on the second retardation film 142. The hard coating layer 150 may be located on the top layer to be exposed to the outside. The hard coating layer 150 may protect the display device 100 from foreign materials or scratches. The hard coating layer 150 may be formed by a material having a high surface hardness. For example, the hard coating layer 150 may be formed of a urethane-based resin or an acrylic resin, but is not limited thereto. The hard coating layer 150 may be formed by directly coating a hard coat composition. As another example, the hard coating layer may be formed by bonding a separate hard coating film onto the second retardation film 142 using an adhesive.

Hereinafter, a rainbow stain improvement effect of a display device according to example embodiments of the present disclosure will be described with reference to FIGS. 3 to 12.

Figure 3:
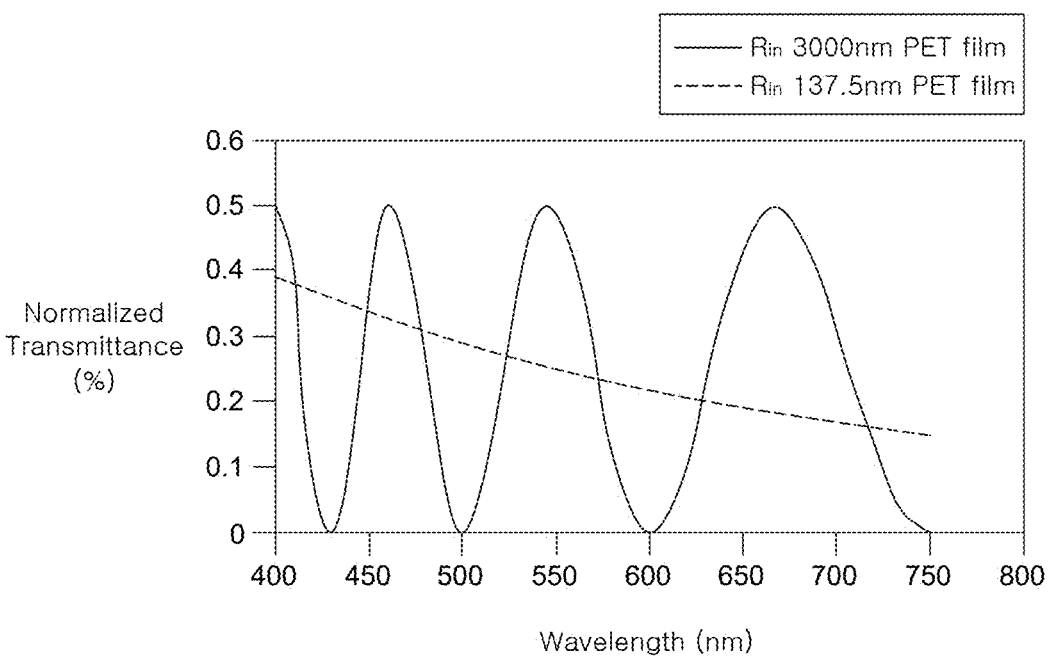
FIG. 3 is a graph of transmittance (in %) versus wavelength (in nm) for a laminate including a PET film having an in-plane phase difference $R_{in}$ of 137.5 nm and a PET film having an in-plane phase difference $R_{in}$ of 3000 nm.
Figure 4:
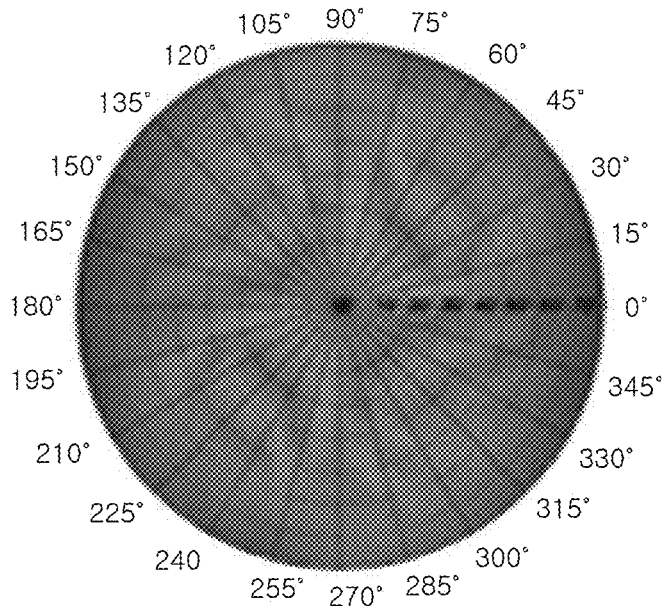
FIG. 4 illustrates a view as seen by a user who wears polarized sunglasses and views a display device including the example embodiment of the laminate having the transmittance as shown in FIG. 3.

FIG. 3 is a graph of transmittance (in %) versus wavelength (in nm) for a laminate including a PET film having an in-plane phase difference $R_{in}$ of 137.5 nm and a PET film having an in-plane phase difference $R_{in}$ of 3000 nm. FIG. 4 illustrates a view as seen by a user who wears polarized sunglasses and views a display device including the example embodiment of the laminate having the transmittance as shown in FIG. 3.

As illustrated in FIG. 3, a PET film having an in-plane phase difference of 137.5 nm and a PET film having an in-plane phase difference of 3000 nm may be laminated, light having a wavelength within the visible light spectrum may be strongly transmitted. Since the difference in transmittance for every wavelength may be large, the color irregularity, the color shift, and the interference color are observed. As illustrated in FIG. 4, the rainbow stain may be strongly visible. For example, the rainbow stain may be strongly visible in any direction of a front side, a left side, and a right side so that the display quality may be degraded.

Figure 5:
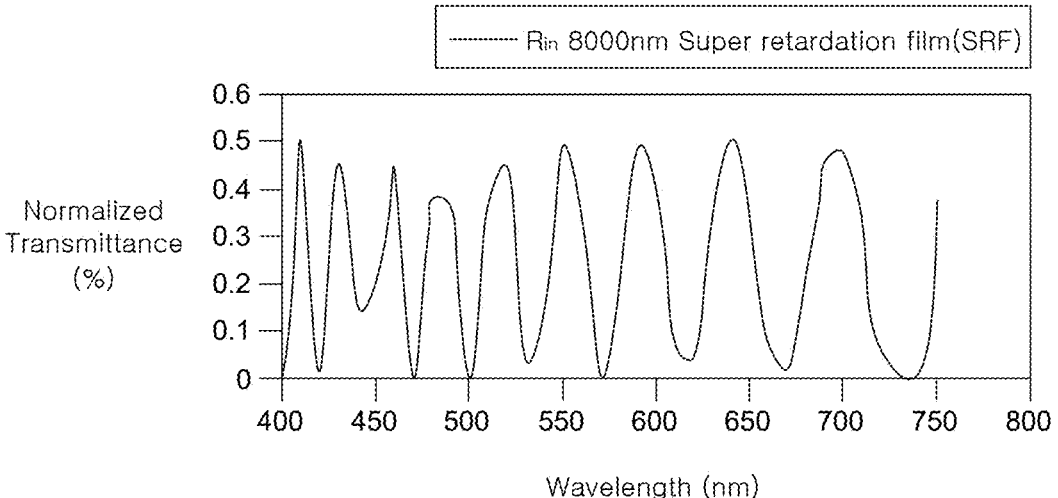
FIG. 5 is a graph of transmittance (in %) versus wavelength (in nm) for a SRF film.
Figure 6:
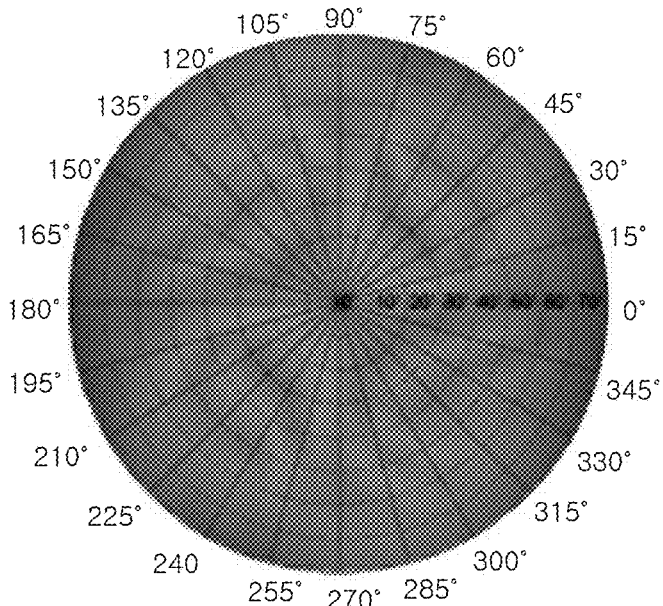
FIG. 6 illustrates a view as seen by a user who wears polarized sunglasses and views a display device including the SRF film having the transmittance as shown in FIG. 5.

FIG. 5 is a graph of transmittance (in %) versus wavelength (in nm) for a SRF film. FIG. 6 illustrates a view as seen by a user who wears polarized sunglasses and views a display device including the SRF film having the transmittance as shown in FIG. 5. The SRF film is a commercially available retardation film having an in-plane phase difference $R_{in}$ of 8000 nm. As illustrated in FIG. 5, in the SRF film having an in-plane phase difference of 8000 nm, more peaks having similar phase differences may be observed in the visible light region as compared with the laminate having the transmittance as shown in FIG. 3. The difference in the transmittance for each wavelength may still be large. Accordingly, when the display screen is viewed while wearing the polarized sunglasses, the rainbow stain may be significantly visible.

Figure 7:
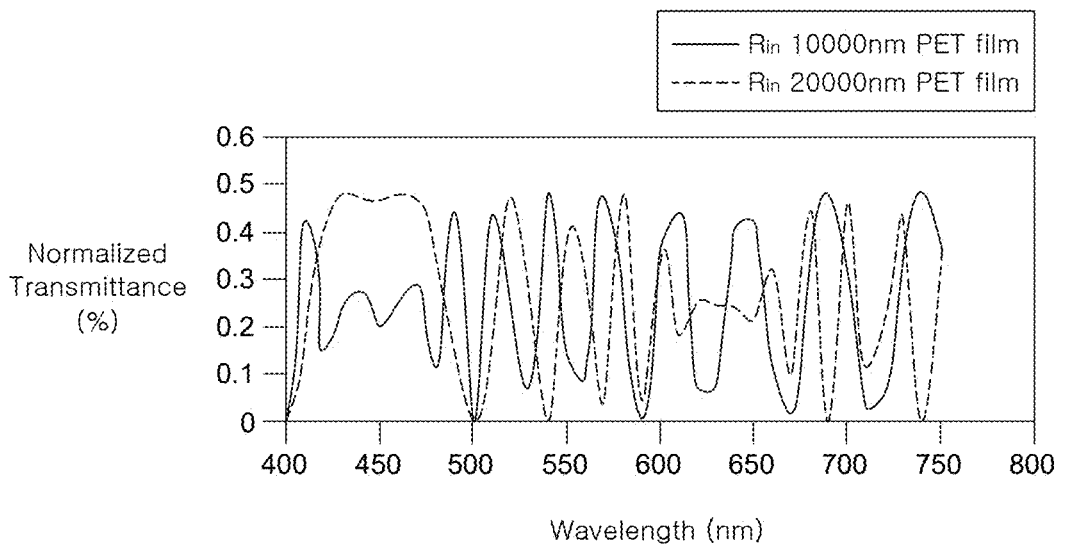
FIG. 7 is a graph of transmittance (in %) versus wavelength (in nm) for a laminate including a PET film having an in-plane phase difference $R_{in}$ of 10000 nm and a PET film having an in-plane phase difference $R_{in}$ of 20000 nm according to an example embodiment of the present disclosure.
Figure 8:
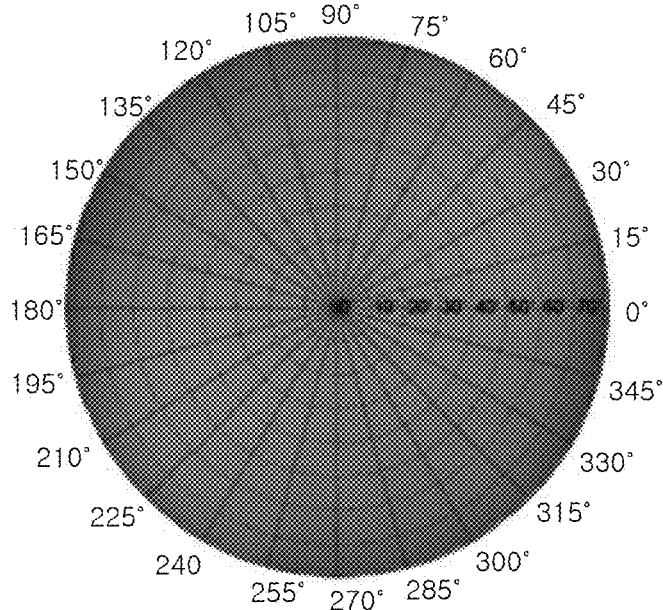
FIG. 8 illustrates a view as seen by a user who wears polarized sunglasses and views a display device including the example embodiment of the laminate having the transmittance as shown in FIG. 7.

FIG. 7 is a graph of transmittance (in %) versus wavelength (in nm) for a laminate including a PET film having an in-plane phase difference $R_{in}$ of 10000 nm and a PET film having an in-plane phase difference $R_{in}$ of 20000 nm according to an example embodiment of the present disclosure. FIG. 8 illustrates a view as seen by a user who wears polarized sunglasses and views a display device including the example embodiment of the laminate having the transmittance as shown in FIG. 7. As illustrated in FIG. 7, between adjacent peaks of a PET film having an in-plane phase difference of 10000 nm, a peak of a PET film having an in-plane phase difference of 20000 nm is observed. Accordingly, in the visible light region, peaks with similar phase differences appear in a short period so that the difference in transmittance for each wavelength may be reduced. As illustrated in FIG. 8, the rainbow stain is hardly visible not only from the front side but also from the lateral viewing angle.

Figure 9:
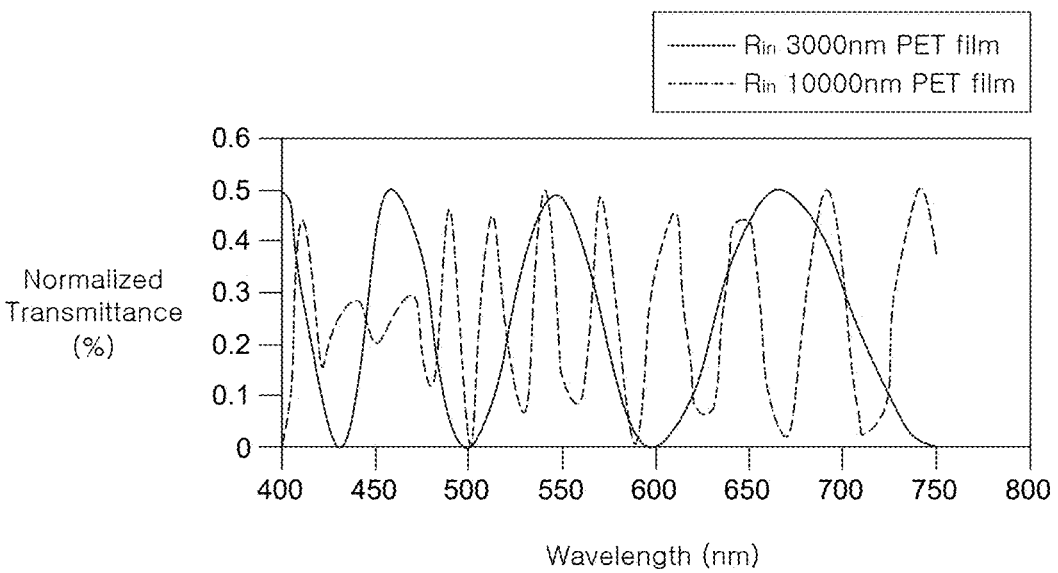
FIG. 9 is a graph of transmittance (in %) versus wavelength (in nm) for a laminate including a PET film having an in-plane phase difference $R_{in}$ of 10000 nm and a PET film having an in-plane phase difference $R_{in}$ of 3000 nm.
Figure 10:
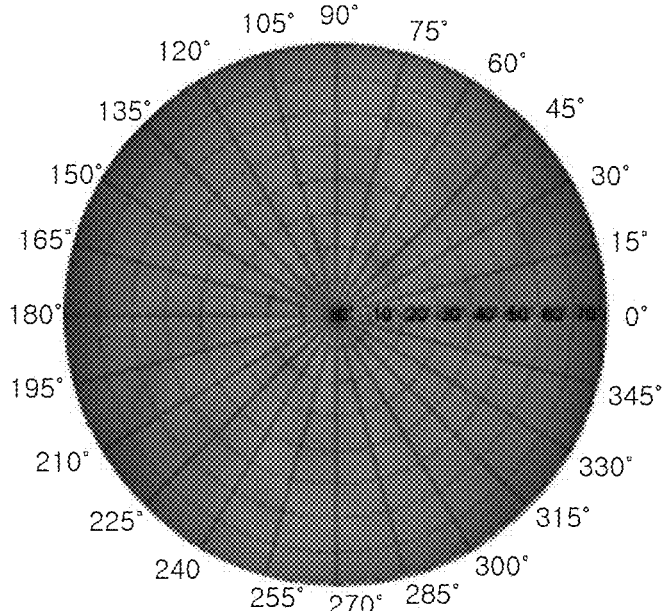
FIG. 10 illustrates a view as seen by a user who wears polarized sunglasses and views a display device including the laminate having the transmittance as shown in FIG. 9.

FIG. 9 is a graph of transmittance (in %) versus wavelength (in nm) for a laminate including a PET film having an in-plane phase difference $R_{in}$ of 10000 nm and a PET film having an in-plane phase difference $R_{in}$ of 3000 nm. FIG. 10 illustrates a view as seen by a user who wears polarized sunglasses and views a display device including the laminate having the transmittance as shown in FIG. 9. As illustrated in FIG. 9, when a PET film having an in-plane phase difference of 10000 nm and a PET film having an in-plane phase difference of 3000 nm are laminated, the difference in transmittance in some wavelengths, such as 580 nm, 625 nm, and 720 nm, may be large as compared with the other wavelengths. Accordingly, as illustrated in FIG. 10, from a front viewing angle, the rainbow stain may be slightly visible, and at the lateral viewing angle, the rainbow stain may be strongly visible.

Figure 11:
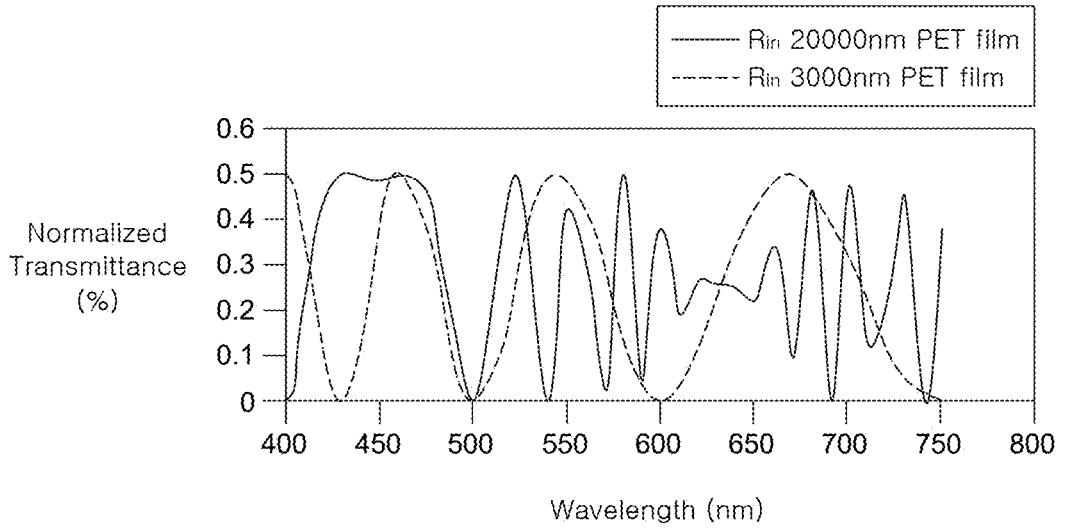
FIG. 11 is a graph of transmittance (in %) versus wavelength (in nm) of a laminate including a PET film having an in-plane phase difference $R_{in}$ of 20000 nm and a PET film having an in-plane phase difference $R_{in}$ of 3000 nm.
Figure 12:
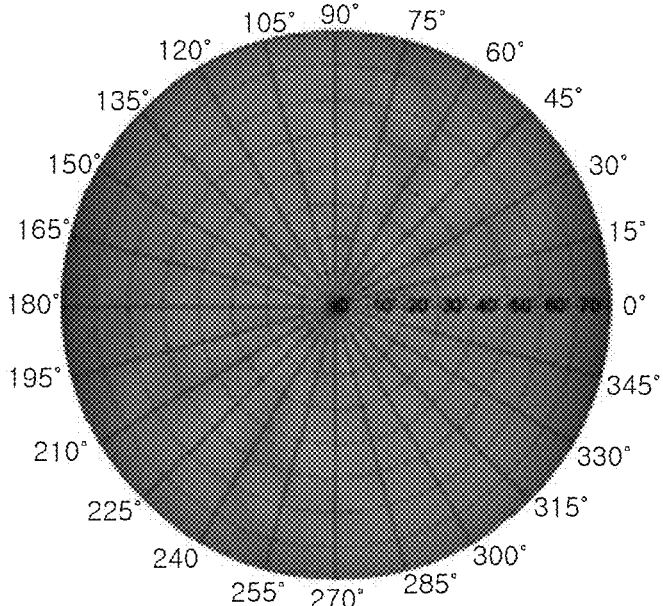
FIG. 12 illustrates a view as seen by a user who wears polarized sunglasses and views a display device including the laminate having the transmittance as shown in FIG. 11.

FIG. 11 is a graph of transmittance (in %) versus a wavelength (in nm) of a laminate including a PET film having an in-plane phase difference $R_{in}$ of 20000 nm and a PET film having an in-plane phase difference $R_{in}$ of 3000 nm. FIG. 12 illustrates a view as seen by a user who wears polarized sunglasses and views a display device including the laminate having the transmittance as shown in FIG. 11. As illustrated in FIGS. 11 and 12 together, when the PET film having an in-plane phase difference of 20000 nm is present, the rainbow stain at the front viewing angle may be further improved as compared with the film of FIGS. 9 and 10. However, the rainbow stain at the lateral viewing angle may still be strongly visible.

In some example embodiments, a first retardation film 141 having an in-plane phase difference of 10000 nm to 15000 nm and a second retardation film 142 having an in-plane phase difference of 20000 nm to 23000 nm may be disposed on the polarization film 120 so that the difference in the transmittance for each wavelength may be reduced in the visible light region. Therefore, the visibility of the rainbow stain may be significantly reduced.

The order of the support film 130, the first retardation film 141, and the second retardation film 142 which may be disposed on the polarization film 120 may be changed. FIGS. 13 to 17 illustrate cross-sectional views of a display device according to other example embodiments of the present disclosure. The example embodiments of the display devices illustrated in each of FIGS. 13 to 17 are substantially the same as the example embodiment of the display device illustrated in FIG. 1 except for the order of the support film 130, the first retardation film 141, and the second retardation film 142.

Figure 13:
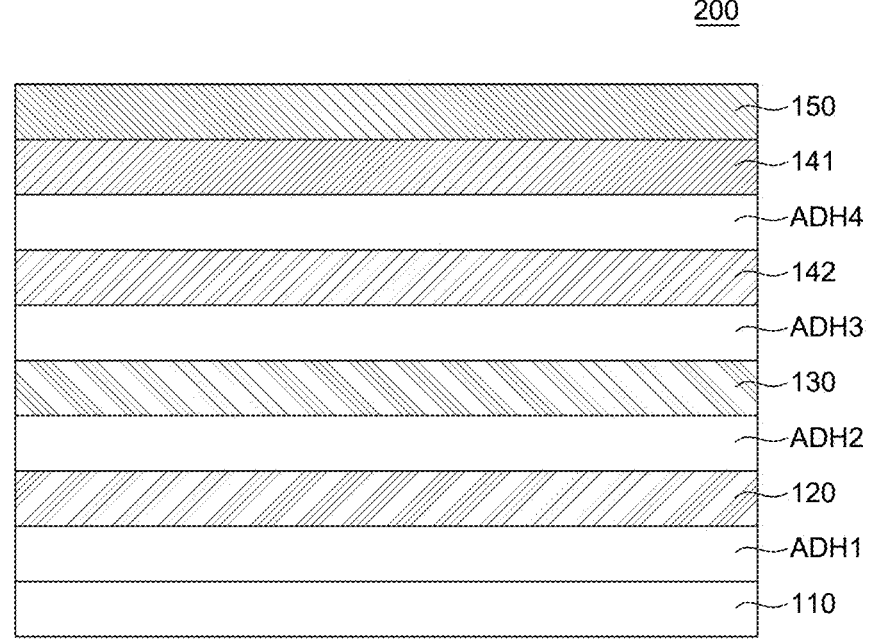
FIGS. 13 to 17 illustrate cross-sectional views of a display device according to other example embodiments of the present disclosure.

As illustrated in FIG. 13, in a display device 200 according to another example embodiment of the present disclosure, the second retardation film 142 may be disposed on the support film 130 and the first retardation film 141 may be disposed on the second retardation film 142. The hard coating layer 150 may be disposed directly on the first retardation film 141. Alternatively, the hard coating layer 150 may be bonded onto the first retardation film 141 by an adhesive.

Figure 14:
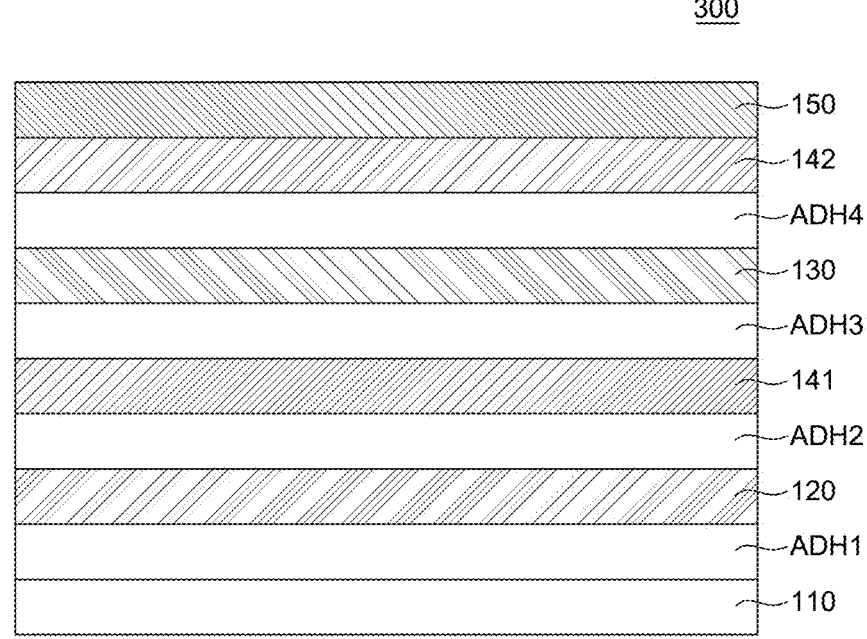

As illustrated in FIG. 14, in a display device 300 according to another example embodiment of the present disclosure, the support film 130 may be disposed between the first retardation film 141 and the second retardation film 142. For example, the first retardation film 141 may be disposed on the polarization film 120, the support film 130 may be disposed on the first retardation film 141, and the second retardation film 142 may be disposed on the support film 130. Adhesive layers ADH3 and ADH4 may be disposed therebetween to bond each of the films. The hard coating layer 150 may be disposed directly on the second retardation film 142. Alternatively, the hard coating layer 150 may be bonded onto the second retardation film 142 by an adhesive.

Figure 15:
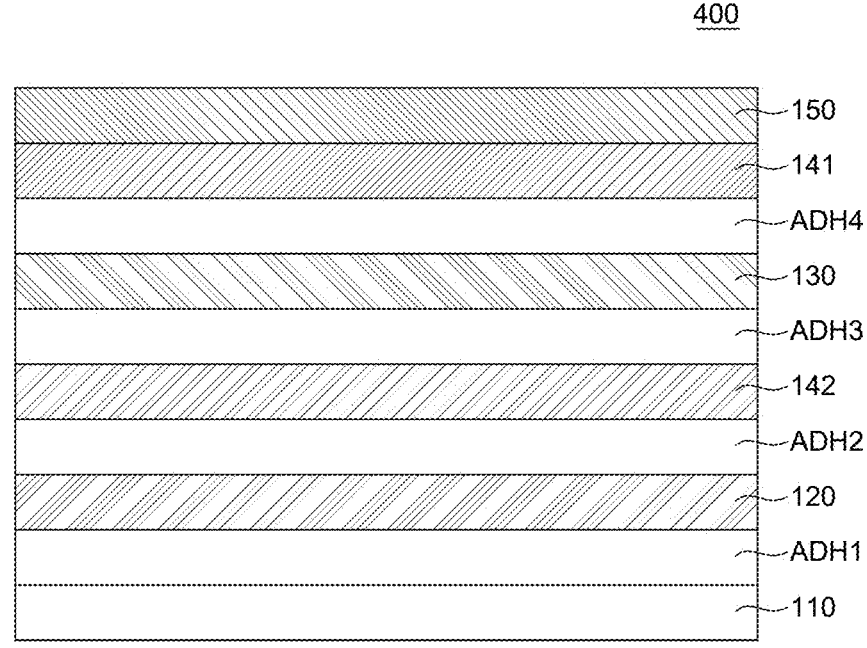

As illustrated in FIG. 15, in a display device 400 according to another example embodiment of the present disclosure, the support film 130 may be disposed between the first retardation film 141 and the second retardation film 142. For example, the second retardation film 142 may be disposed on the polarization film 120, the support film 130 may be disposed on the second retardation film 142, and the first retardation film 141 may be disposed on the support film 130. Adhesive layers ADH3 and ADH4 may be disposed therebetween to bond each of the films. The hard coating layer 150 may be disposed directly on the first retardation film 141. Alternatively, the hard coating layer 150 may be bonded onto the first retardation film 141 by an adhesive.

Figure 16:
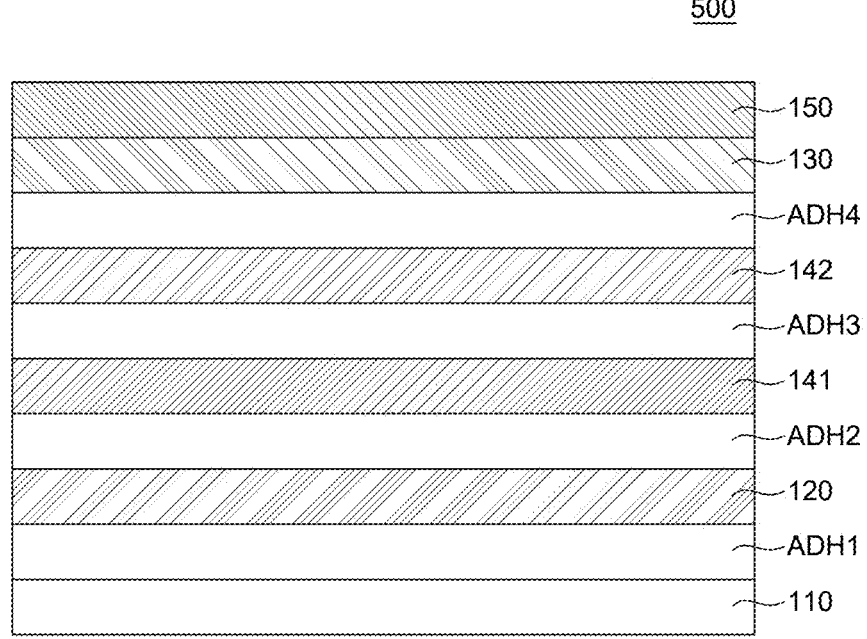

As illustrated in FIG. 16, in a display device 500 according to another example embodiment of the present disclosure, the support film 130 may be disposed above a plurality of retardation films 141 and 142. For example, the first retardation film 141 may be disposed on the polarization film 120, the second retardation film 142 may be disposed on the first retardation film 141, and the support film 130 may be disposed on the second retardation film 142. The support film 130 may be disposed on the plurality of retardation films 141 and 142, where a surface of the support film 130 facing away from the plurality of retardation films 141 and 142 may also face away from the display panel 110. The hard coating layer 150 may be disposed directly on the support film 130. As another example, the hard coating layer 150 may be bonded onto the support film 130 by an adhesive.

Figure 17:
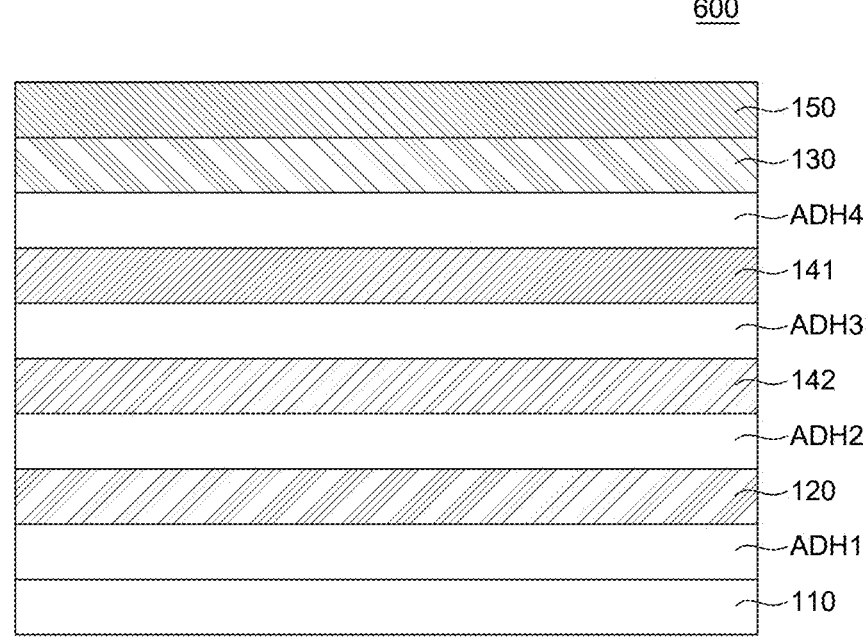

As illustrated in FIG. 17, in a display device 600 according to another example embodiment of the present disclosure, the support film 130 may be disposed above a plurality of retardation films 141 and 142. For example, the second retardation film 142 may be disposed on the polarization film 120, the first retardation film 141 may be disposed on the second retardation film 142, and the support film 130 may be disposed on the first retardation film 141. The support film 130 may be disposed between the plurality of retardation films 141 and 142 and the hard coating layer 150. The hard coating layer 150 may be disposed directly on the support film 130. As another example, the hard coating layer 150 may be bonded onto the support film 130 by an adhesive.

Each of the example embodiments of display devices illustrated in FIGS. 13 to 17 may have a different position of the first retardation film 141 having an in-plane phase difference of 10000 nm to 15000 nm, a second retardation film 142 having an in-plane phase difference of 20000 nm to 23000 nm, and a support film 130 from the example embodiment of the display device illustrated in FIG. 1. However, the same effect may be provided. As illustrated in FIGS. 7 and 8, when the first retardation film 141 and the second retardation film 142 may be laminated, in a wavelength band in which transmittance between adjacent peaks in a transmittance spectrum of the first retardation film 141 sharply drops, the transmittance peak of the second retardation film 142 may compensate for the transmittance. Accordingly, in the visible light region, peaks with similar phase differences appear in a short period, so that the difference in transmittance for each wavelength may be reduced. Thus, the rainbow stain may not be visible not only from the front viewing angle, but also from the lateral viewing angle so that the display quality may be excellent.

The example embodiments of the present disclosure may be described as follows.

According to an aspect of the present disclosure, a display device may include a display panel, a polarization film disposed on the display panel and a plurality of retardation films disposed on the polarization film and each of the plurality of retardation films may have different in-plane phase differences $R_{in}$, wherein the in-plane phase difference $R_{in}$ of each of the plurality of retardation films may be 10000 nm or larger.

According to some embodiments of the present disclosure, the plurality of retardation films may include a first retardation film and a second retardation film, an in-plane phase difference $R_{in}$ of the first retardation film may be 10000 nm to 15000 nm, and an in-plane phase difference $R_{in}$ of the second retardation film may be 20000 nm to 23000 nm.

According to some embodiments of the present disclosure, an optical axis of the first retardation film and an optical axis of the second retardation film may be arranged at 90±10°.

According to some embodiments of the present disclosure, the optical axis of the first retardation film and an optical axis of the polarization film may be arranged at 45±10° or 135±10° and the optical axis of the second retardation film and the optical axis of the polarization film may be arranged at 45±10° or 135±10°.

According to some embodiments of the present disclosure, the optical axis of the first retardation film and the optical axis of the polarization film may be arranged at 45±10°, and the optical axis of the second retardation film and the optical axis of the polarization film may be arranged at 135±10°.

According to some embodiments of the present disclosure, the optical axis of the first retardation film and the optical axis of the polarization film may be arranged at 135±10°, and the optical axis of the second retardation film and the optical axis of the polarization film may be arranged at 45±10°.

According to some embodiments of the present disclosure, each of the plurality of retardation films has a thickness direction phase difference $R_{th}$, and the thickness direction phase difference $R_{th}$ may be 0.5 times or less of the in-plane phase difference $R_{in}$.

According to some embodiments of the present disclosure, the display device may further include a support film disposed between the polarization film and the plurality of retardation films or above the plurality of retardation films, or between the first retardation film and the second retardation film.

According to some embodiments of the present disclosure, the support film may be disposed on the polarization film, the second retardation film may be disposed between the polarization film and the support film, and the first retardation film may be disposed on the support film.

According to some embodiments of the present disclosure, the support film may be disposed on the polarization film, the first retardation film may be disposed on the support film, and the second retardation film may be disposed on the first retardation film.

According to some embodiments of the present disclosure, the support film may be disposed between the polarization film and the plurality of retardation films.

According to some embodiments of the present disclosure, the support film may be disposed between the first retardation film and the second retardation film.

According to some embodiments of the present disclosure, the display device may further include a support film disposed on the plurality of retardation films, where a surface of the support film facing away from the plurality of retardation films also faces away from the display panel.

According to some embodiments of the present disclosure, a thickness of each of the plurality of retardation films may be 30 μm to 120 μm.

According to some embodiments of the present disclosure, each of the plurality of retardation films may include at least one of polyethylene terephthalate, polyethersulfone, polycarbonate, polyimide, polypropylene, cycloolefin polymer, cycloolefin copolymer, and polymethylmethacrylate.

According to some embodiments of the present disclosure, each of the plurality of retardation films may have a storage modulus of $10^6$ Pa to $10^9$ Pa and a Poisson ratio of 0.30 to 0.43.

Although the example embodiments of the present disclosure have been described in detail with reference to the accompanying drawings, the present disclosure is not limited thereto and may be embodied in many different forms without departing from the technical concept or scope of the present disclosure. The example embodiments of the present disclosure are provided for illustrative purposes only and are not intended to limit the technical concept or scope of the present disclosure. Therefore, it should be understood that the above-described example embodiments are illustrative in all aspects and do not limit the present disclosure. Furthermore, the feature, structure, and effect described in at least one example embodiment of the present disclosure may be implemented through combination with or modification of other example embodiments by those skilled in the art. Therefore, contents associated with such combination and modification should be construed as being within the scope of the present disclosure. The protective scope of the present disclosure should be construed based on claims and equivalents, and all the technical concepts in the equivalent scope thereof should be construed as falling within the scope of the present disclosure.

What is claimed is:

1. A display device, comprising:
a display panel;
a polarization film disposed on the display panel; and
a plurality of retardation films disposed on the polarization film,
wherein an in-plane phase difference $R_{in}$ of each of the plurality of retardation films is different,
wherein the in-plane phase difference $R_{in}$ of each of the plurality of retardation films is 10000 nm or larger,
wherein the plurality of retardation films includes a first retardation film and a second retardation film, an in-plane phase difference $R_{in}$ of the first retardation film is 10000 nm to 15000 nm, and an in-plane phase difference $R_{in}$ of the second retardation film is 20000 nm to 23000 nm.

2. The display device according to claim 1, wherein an optical axis of the first retardation film and an optical axis of the second retardation film are arranged at 90±10°.

3. The display device according to claim 2, wherein the optical axis of the first retardation film and an optical axis of the polarization film are arranged at 45±10° or 135±10° and the optical axis of the second retardation film and the optical axis of the polarization film are arranged at 45±10° or 135±10°.

4. The display device according to claim 3, wherein the optical axis of the first retardation film and the optical axis of the polarization film are arranged at 45±10°, and the optical axis of the second retardation film and the optical axis of the polarization film are arranged at 135±10°.

5. The display device according to claim 3, wherein the optical axis of the first retardation film and the optical axis of the polarization film are arranged at 135±10°, and the optical axis of the second retardation film and the optical axis of the polarization film are arranged at 45±10°.

6. The display device according to claim 1, wherein each of the plurality of retardation films has a thickness direction phase difference $R_{th}$, and the thickness direction phase difference $R_{th}$ is 0.5 times or less of the in-plane phase difference $R_{in}$.

7. The display device according to claim 1, further comprising:
a support film disposed between the polarization film and the plurality of retardation films, or above the plurality of retardation films, or between the first retardation film and the second retardation film.

8. The display device according to claim 7, wherein the support film is disposed on the polarization film, the second retardation film is disposed between the polarization film and the support film, and the first retardation film is disposed on the support film.

9. The display device according to claim 7, wherein the support film is disposed on the polarization film, the first retardation film is disposed on the support film, and the second retardation film is disposed on the first retardation film.

10. The display device according to claim 7, wherein the support film is disposed between the polarization film and the plurality of retardation films.

11. The display device according to claim 7, wherein the support film is disposed between the first retardation film and the second retardation film.

12. The display device according to claim 1, further comprising a support film disposed on the plurality of retardation films, wherein a surface of the support film facing away from the plurality of retardation films also faces away from the display panel.

13. The display device according to claim 1, wherein a thickness of each of the plurality of retardation films is 30 µm to 120 µm.

14. The display device according to claim 1, wherein each of the plurality of retardation films includes at least one of polyethylene terephthalate, polyethersulfone, polycarbonate, polyimide, polypropylene, cycloolefin polymer, cycloolefin copolymer, and polymethylmethacrylate.

15. The display device according to claim 1, wherein each of the plurality of retardation films has a storage modulus of $10^6$ Pa to $10^9$ Pa and a Poisson ratio of 0.30 to 0.43.

* * * * *